(12) United States Patent
Trefonas, III et al.

(10) Patent No.: US 7,582,585 B2
(45) Date of Patent: Sep. 1, 2009

(54) COATING COMPOSITIONS

(75) Inventors: Peter Trefonas, III, Medway, MA (US); Sungseo Cho, Milford, MA (US); David L. Goff, Hockessin, DE (US); J. Ioan Matthews, Hockessin, DE (US); Hao Yun, Freehold, NJ (US)

(73) Assignees: Rohm and Haas Electronic Materials LLC, Marlborough, MA (US); E.I. duPont De Nemours and Company, Wilmington, DE (US)

( * ) Notice: Subject to any disclaimer, the term of this patent is extended or adjusted under 35 U.S.C. 154(b) by 692 days.

(21) Appl. No.: 11/026,179

(22) Filed: Dec. 30, 2004

(65) Prior Publication Data

US 2005/0181299 A1   Aug. 18, 2005

Related U.S. Application Data

(60) Provisional application No. 60/533,658, filed on Dec. 30, 2003.

(51) Int. Cl.
*B01J 21/18* (2006.01)
(52) U.S. Cl. ....................... 502/171; 438/758
(58) Field of Classification Search .............. 430/270.1; 438/758; 502/150, 171
See application file for complete search history.

(56) References Cited

U.S. PATENT DOCUMENTS

| 4,182,853 | A | 1/1980 | Kruh |
| 4,944,902 | A | 7/1990 | Lanier et al. |
| 5,635,333 | A | 6/1997 | Petersen et al. |
| 5,744,537 | A | 4/1998 | Brunsvold et al. |
| 6,261,743 | B1 | 7/2001 | Pavelchek et al. |
| 6,451,503 | B1 | 9/2002 | Thackeray et al. |
| 6,602,652 | B2 | 8/2003 | Adams et al. |
| 6,653,049 | B2 | 11/2003 | Pavelchek et al. |
| 6,767,689 | B2 | 7/2004 | Pavelchek et al. |
| 6,852,421 | B2 | 2/2005 | Wayton et al. |
| 6,887,648 | B2 | 5/2005 | Pavelchek et al. |
| 2003/0032298 | A1 | 2/2003 | Noda |
| 2003/0129531 | A1 | 7/2003 | Oberlander et al. |
| 2003/0166828 | A1 | 9/2003 | Cox et al. |

*Primary Examiner*—Edward M Johnson
(74) *Attorney, Agent, or Firm*—Peter F. Corless; Darryl P. Frickey; Edwards Angell Palmer & Dodge LLP

(57) ABSTRACT

Coating compositions are provided that include a component that is a product of materials comprising an amine and an anhydride and/or an anhydride derivative. Compositions of the invention are particularly useful as an underlying antireflective coating composition ("ARC") employed with an overcoated photoresist layer in the manufacture of microelectronic wafers and other electronic devices.

26 Claims, 3 Drawing Sheets

600nm

600nm

200nm

250nm

150nm

160nm

600nm

600nm

200nm

200nm

190nm

150nm

COATING COMPOSITIONS

The present application claims the benefit of U.S. provisional application No. 60/533,658 filed Dec. 30, 2003, which is incorporated by reference herein in its entirely.

BACKGROUND

1. Field of the Invention

The present invention relates to compositions that include a component that is a product of materials comprising an amine and an anhydride and/or an anhydride derivative. Coating compositions of the invention are particularly useful as an underlying antireflective coating composition ("ARC") employed with an overcoated photoresist layer in the manufacture of microelectronic wafers and other electronic devices.

2. Background

Photoresists are photosensitive films used for the transfer of images to a substrate. A coating layer of a photoresist is formed on a substrate and the photoresist layer is then exposed through a photomask to a source of activating radiation. The photomask has areas that are opaque to activating radiation and other areas that are transparent to activating radiation. Exposure to activating radiation provides a photo-induced or chemical transformation of the photoresist coating to thereby transfer the pattern of the photomask to the photoresist-coated substrate. Following exposure, the photoresist is developed to provide a relief image that permits selective processing of a substrate.

A photoresist can be either positive-acting or negative-acting. For most negative-acting photoresists, those coating layer portions that are exposed to activating radiation polymerize or crosslink in a reaction between a photoactive compound and polymerizable reagents of the photoresist composition. Consequently, the exposed coating portions are rendered less soluble in a developer solution than unexposed portions. For a positive-acting photoresist, exposed portions are rendered more soluble in a developer solution while areas not exposed remain comparatively less soluble in the developer solution. Photoresist compositions are described in Deforest, *Photoresist Materials and Processes,* McGraw Hill Book Company, New York, ch. 2, 1975 and by Moreau, *Semiconductor Lithography, Principles, Practices and Materials,* Plenum Press, New York, ch. 2 and 4.

A major use of photoresists is in semiconductor manufacture where an object is to convert a highly polished semiconductor slice, such as silicon or gallium arsenide, into a complex matrix of electron conducting paths, preferably of micron or submicron geometry, that perform circuit functions. Proper photoresist processing is a key to attaining this object. While there is a strong interdependency among the various photoresist processing steps, exposure is believed to be one of the most important steps in attaining high resolution photoresist images.

Reflection of activating radiation used to expose a photoresist often poses limits on resolution of the image patterned in the photoresist layer. Reflection of radiation from the substrate/photoresist interface can produce spatial variations in the radiation intensity in the photoresist, resulting in non-uniform photoresist linewidth upon development. Radiation also can scatter from the substrate/photoresist interface into regions of the photoresist where exposure is not intended, again resulting in linewidth variations. The amount of scattering and reflection will typically vary from region to region, resulting in further linewidth non-uniformity. Variations in substrate topography also can give rise to resolution-limiting problems.

One approach used to reduce the problem of reflected radiation has been the use of a radiation absorbing layer interposed between the substrate surface and the photoresist coating layer. See for example, PCT Application WO 90/03598, EPO Application No. 0 639 941 A1 and U.S. Pat. Nos. 4,910,122, 4,370,405, 4,362,809, and 5,939,236. Such layers have also been referred to as antireflective layers or antireflective compositions. See also U.S. Pat. Nos. 6,602,652; 6,528,235; 6,316,165; 6,190,839; 5,939,236; 5,886,102; 5,851,738; and 5,851,730, all assigned to the Shipley Company, which disclose highly useful antireflective compositions.

While current organic antireflective coating compositions are highly effective for many applications, it is also frequently desired to have particular antireflective compositions to meet specific processing requirements. For instance, it may be desired to remove a crosslinked antireflective layer that has been bared of overcoated photoresist (e.g. with a positive resist, exposed resist areas removed by alkaline aqueous developer) by means other than a plasma etchant. See U.S. Pat. No. 5,635,333; U.S. Patent Publication 2003/0166828; and U.S. Patent Publication 2003/0129531. Such approaches offer the potential of avoiding the additional processing steps and pitfalls associated with plasma etchant removal of a bottom antireflective coating layer. See U.S. Patent Publication 2003/0032298, which reports an attempt to address problems with plasma etching.

It would be desirable new compositions that could be used as underlying antireflective coating layer in the manufacture of microelectronic wafers. It would be particularly desirable to have new compositions that could be used as underlying antireflective coating layer and could be removed with an aqueous photoresist developer.

SUMMARY OF THE INVENTION

We have now discovered new coating compositions that comprise an amine reaction product and that are particularly useful as underlying antireflective coating layers for an overcoated photoresist layer.

Significantly, preferred processed (e.g., thermally cured) coating compositions of the invention also may be removed to expose an underlying surface with an aqueous alkaline developer used for development of an overcoated photoresist layer. This offers a number of notable advantages, including reducing the additional processing step and costs required with use of a plasma etchant to remove the underlying coating layer.

More particularly, in a first aspect, the invention provides compositions that contain a component (sometimes referred to herein as "reaction component") that is an admixture product of materials comprising one or more amines and one or more anhydrides or anhydride derivatives. Preferred amine reagents include compounds that comprise i) three or more amine moieties and/or ii) one or more heterocyclic groups. Preferred amine compounds that have one or more heterocyclic groups include those compounds having a heterocycle that has at least one ring nitrogen. Preferred anhydride reagents are di-anhydrides and other reagents having multiple anhydride moieties as well as compounds that have derivatized anhydride groups such as an esterified anhydride group.

A reaction component of a coating composition of the invention may comprise a single chemical entity or a mixture of materials, i.e. a plurality of distinct admixture of products of one or more amines and one or more anhydride compounds and/or anhydride derivative compounds. It thus will be understood that reference herein to "a reaction component" of a coating composition is inclusive of such a mixture of distinct materials.

As referred to herein, an "anhydride derivative" is inclusive of those groups or compounds that contains moieties that can be functionalized to an anhydride, e.g. a compound that comprises 1) two acid (—COOH) groups that can be functionalized to an anhydride; 2) two ester groups that can be functionalized to an anhydride; and/or 3) an acid and an ester that can be functionalized to an anhydride. As particular examples, compounds or groups that comprise phthalic acid, isophthalic acid and corresponding esters thereof such as $C_6H_4(COO)(COOC_{1-12}alkyl)$, $C_6H_4(COOC_{1-12}alkyl)_2$ and the like.

Preferred reaction components for use in a composition of the invention include materials that have a relatively low molecular weight prior to thermal processing of a composition of the invention, e.g., preferably a reaction component has a molecular weight of less than 2,000 daltons, more preferably about 1,800, 1,500, 1,000, 800 or 500 daltons or less.

However, higher molecular weight materials also will be useful for many applications, e.g. reaction components that comprise a material having a molecular weight of about 2,000 daltons or greater, including 4,000, 5,000, 6,000, 8,000, 10,000 and 12,000 daltons or greater.

Particularly preferred reaction components also are substantially non-polymeric materials prior to thermal processing of a composition of the invention, e.g., such preferred reaction components will not contain more than 2, 3, 4 or 5 of the same type of chemical unit (preferably, just 1, 2 or 3 i.e. only monomers, dimers or trimers) covalently linked. Thus, in the case of the reaction component being a admixture or reaction product of materials comprising an amine and an anhydride, such preferred substantially non-polymeric reaction components will comprise in covalent linkage no more than 1, 2, 3, 4 or 5, more preferably just 1, 2 or 3, separate units each formed by reaction of an amine and anhydride.

Particularly preferred reaction components also include polymeric salts at least prior to thermal processing of a coating composition of the invention. Such polymeric salts may be substantially non-polymeric materials as discussed above, i.e. a polymeric salt will not contain a substantial number (>5) of the same type of chemical unit (e.g. a unit formed by reaction of an amine and anhydride or anhydride derivative) in covalent linkage, but will contain such multiple, repeated chemical units linked by ionic, non-covalent interactions (i.e. as a salt).

Coating compositions of the invention may optionally contain one or more other materials in addition to the reaction component. For example, a coating composition of the invention may contain an additional component that comprises chromophore groups that can absorb undesired radiation used to expose the overcoated resist layer from reflecting back into the resist layer. Such chromophore groups may be present a variety of composition components including the reaction component itself or an additional component may comprise chromophore groups such as an added resin which may have chromophore groups as backbone members or as pendant groups, and/or an added small molecule (e.g. MW less than about 1000 or 500) that contains one or more chromophore moieties.

Generally preferred chromophores for inclusion in coating composition of the invention particularly those used for antireflective applications include both single ring and multiple ring aromatic groups such as optionally substituted phenyl, optionally substituted naphthyl, optionally substituted anthracenyl, optionally substituted phenanthracenyl, optionally substituted quinolinyl, and the like. Particularly preferred chromophores may vary with the radiation employed to expose an overcoated resist layer. More specifically, for exposure of an overcoated resist at 248 nm, optionally substituted anthracene and optionally substituted naphthyl are preferred chromophores of the antireflective composition. For exposure of an overcoated resist at 193 nm, optionally substituted phenyl and optionally substituted naphthyl are particularly preferred chromophores.

As mentioned above, the reaction component itself can provide antireflective properties, particularly where an amine, anhydride or anhydride derivative used to form the reaction component comprises an aromatic group such as a carbocyclic aryl e.g. phenyl, anthracene, naphthyl and the like, or a heteroaromatic such as pyridinyl and the like.

Additionally, as a material distinct from the reaction component, a coating composition may optionally comprise a material that will crosslink or otherwise cure (participate in molecular weight increase of one or more other composition components) upon e.g. thermal or activating radiation treatment of a coating layer of the composition. Preferred crosslinker components include amine-containing material such as a melamine or benzoguanamine compound or resin.

Coating compositions of the invention also may optionally comprise an acid or acid generator compound to facilitate reaction of composition component(s) during thermal processing of an applied composition coating layer. A thermal acid generator compound (i.e. a compound that can generate acid upon thermal treatment) is generally preferred.

In addition to such an acid or acid generator compound, coating compositions may optionally comprise one or more photoacid generators compounds, i.e. one or more compounds that will generate an acid upon treatment with radiation used to expose an overcoated photoresist layer.

By such use of photoacid generator compound(s), acid is not liberated from the photoacid generator compound(s) prior to application of a photoresist layer over the underlying coating composition. Exposure of the applied resist layer to patterned activating radiation liberates acid from the coating composition photoacid generator compound(s) and can enhance resolution of the resist image patterned over the coating composition layer by compensating for photoacid at the resist/coating composition that may diffuse from the resist into the coating composition. Such use of one or more photoacid generator compounds in the coating composition layer does not render the coating composition photoimageable.

However it has been found that good results can be obtained where a composition of the invention does not include one or more of such optional components. That is, good results as an antireflective layer are provided by a coating composition that comprises a reaction component, but does contain one or more of 1) an added crosslinker component, 2) an added acid or acid generator compound (particularly thermal acid generator), and/or 3) a photoacid generator to enhance resolution of an relief image of an overcoated photoresist.

In such compositions of the invention that do not contain a separate crosslinker, during thermal cure of a composition coating layer, materials of the reaction component can react to provide a molecular weight increase.

In any event, for use as antireflective layer with an overcoated photoresist, preferably a layer of a composition of the invention is thermally treated (e.g. to increase molecular weight of composition component(s)) prior to applying a photoresist composition layer over the composition layer.

More particularly, a coating composition may be provided by an admixture of a reaction component and one or more optional components as discussed above in a solvent component. The solvent component suitably may be one or more organic solvents such as one or more alcohol solvents e.g. ethyl lactate, propylene glycol methyl ether acetate (1-methoxy-2-propanol acetate), propylene glycol methyl ether (1-methoxy-2-propanol), methyl-2-hydroxyisobutyrate, and the like, and/or one more non-hydroxy solvents such as ethyl ethoxy propionate and the like.

The coating composition is then applied such as by spin-coating (i.e. a spin-on composition) to a substrate such as a microelectronic semiconductor wafer. The solvent carrier may be removed by heating, e.g. 110° C. to 140° C. on a vacuum hotplate. The dried composition coating layer then may be thermally treated such as by heating at 180° C., 200° C. or 250° C. or more for 1 or 2 minutes or more.

It has been found that reaction components as discussed above, including e.g. substantially non-polymeric materials including the polymeric salts, may undergo further reaction during this thermal cure including to form polyamic acids as well as imidization of the polyamic acids to form polyamides.

A variety of photoresists may be used in combination (i.e. overcoated) with a coating composition of the invention. Preferred photoresists for use with the antireflective compositions of the invention are chemically-amplified resists, especially positive-acting photoresists that contain one or more photoacid generator compounds and a resin component that contains units that undergo a deblocking or cleavage reaction in the presence of photogenerated acid, such as pbotoacid-labile ester, acetal, ketal or ether units. Negative-acting photoresists also can be employed with coating compositions of the invention, such as resists that crosslink (i.e. cure or harden) upon exposure to activating radiation. Preferred photoresists for use with a coating composition of the invention may be imaged with relatively short-wavelength radiation, e.g. radiation having a wavelength of less than 300 nm or less than 260 nm such as about 248 nm, or radiation having a wavelength of less than about 200 nm or less than about 170 nm, such as about 193 nm or 157 nm.

The invention further provides methods for forming a photoresist relief image and novel articles of manufacture comprising substrates (such as a microelectronic wafer substrate) coated with an antireflective composition of the invention alone or in combination with a photoresist composition.

As discussed above, a processed (thermal treatment preferably to induce molecular weight increase) coating composition layer may be removed with the same aqueous, alkaline developer solution used to develop an overcoated photoresist layer, i.e. both the exposed photoresist layer and underlying cured coating composition can be removed in a single step with an aqueous alkaline developer in those regions defined by the photomask during exposure.

Thus, more particularly, preferred methods of the invention may include:
1. Applying a coating layer of a composition that comprises a reaction component as discussed above. The composition coating layer may be applied over a variety of substrates including a microelectronic wafer;
2. Curing the applied composition layer such as by thermal treatment. The curing can render the composition layer substantially insoluble in photoresist casting solvents such as ethyl lactate, propylene glycol methyl ether acetate, 2-heptanone, and the like. Such curing also can result in an increase in molecular weight of the reaction component as discussed above, e.g. to form polyamic acids and/or polyimides;
3. Applying a photoresist composition coating layer over the cured underlying composition coating layer. The applied photoresist layer is exposed to activating radiation such as radiation having a wavelength of below 300 nm such as 248 nm, or below 200 nm such as 193 nm or 157 nm, typically through a photomask to form a patterned image in the resist layer. The exposed photoresist may be thermally treated as needed to enhance or form the latent image;
4. The exposed photoresist layer is then treated with a developer solution, such as an aqueous, alkaline developer solution. The developer solution can remove the image defined in the resist layer (in the case of a positive resist, exposed regions are removed; in the case of a negative resist, unexposed regions are removed). In preferred methods, the aqueous, alkaline developer also will remove the cured coating composition in those regions underlying the photoresist layer regions removed by the developer.

In one preferred aspect, an underlying coating composition of the invention is used in combination with a negative-acting photoresist, e.g. as may be imaged at sub-300 nm and sub-200 nm wavelengths such as 248 nm or 193 nm. Preferred negative-acting photoresists for sub-300 nm imaging such as 248 nm comprise a phenolic resin, a photoacid generator compound and an amine-based crosslinker such as a melamine resin. Such preferred negative-acting photoresists are disclosed e.g. in U.S. Pat. Nos. 5,514,520; 5,340,696 and 5,210,000, and European Published Application EP0462391. Preferred negative-acting photoresists for use at sub-200 nm imaging such as 193 nm imaging are substantially free of aromatic groups particularly resins that contain phenyl or other aromatic substitution. Preferred negative-acting photoresists for sub-200 nm imaging such as 193 nm are disclosed in International Application WO/0377028.

In another preferred aspect, an underlying coating composition of the invention is used in combination with a positive-acting photoresist, e.g. as may be imaged at sub-300 nm and sub-200-nm wavelengths such as 248 nm or 193 nm. Chemically-amplified positive resists are preferred, which contain a component that has moieties that will undergo a deblocking or cleavage reaction in the presence of photogenerated acid, such as photoacid-labile esters or acetals. Preferred positive-acting photoresists for sub-300 nm imaging such as 248 nm comprise a polymer that comprises phenolic units and acid-labile esters and/or acetal moieties and a photoacid generator compound. Preferred positive-acting photoresists for use at sub-200 nm imaging such as 193 nm imaging are substantially free of aromatic groups, particularly resins that contain phenyl or other aromatic substitution.

In another aspect, the invention also includes methods for producing a coating compositions of the invention, and methods for forming a photoresist relief image and methods for manufacturing an electronic device such as a processed microelectronic wafer.

Preferred methods for producing a coating composition of the invention include admixing 1) one or more compounds that have i) three or more amine moieties and/or ii) one or more heterocyclic groups where the heterocycle has at least one ring nitrogen with 2) one or more anhydride compounds and/or anhydride derivative compounds.

The admixed components are preferably heated such as to about 40° C., 50° C., 60° C., 70° C. or 80° C. or more to promote covalent bond-forming reaction(s) between the admixed materials. Admixture or reaction times can vary and suitably may be from 0.5 to 20 hours or more. Unreacted amine groups of the materials produced by the admixture can be further reacted if desired such as to form an imide by reaction with a mono-anhydride compound, e.g. compound having a single anhydride groups and a molecular weight of about 250 daltons or less such as phthallic anhydride or trimetallic anhydride. The thus obtained reaction component can be formulated in one or more solvents for coating onto a substrate such as a microelectronic wafer substrate.

In another aspect, the invention also comprises new materials useful as components of coating compositions described herein. Preferred materials include the reaction components described herein, particularly the substantially non-polymeric reaction components.

Other aspects of the invention are disclosed infra.

DETAILED DESCRIPTION OF THE INVENTION

Figure 1:
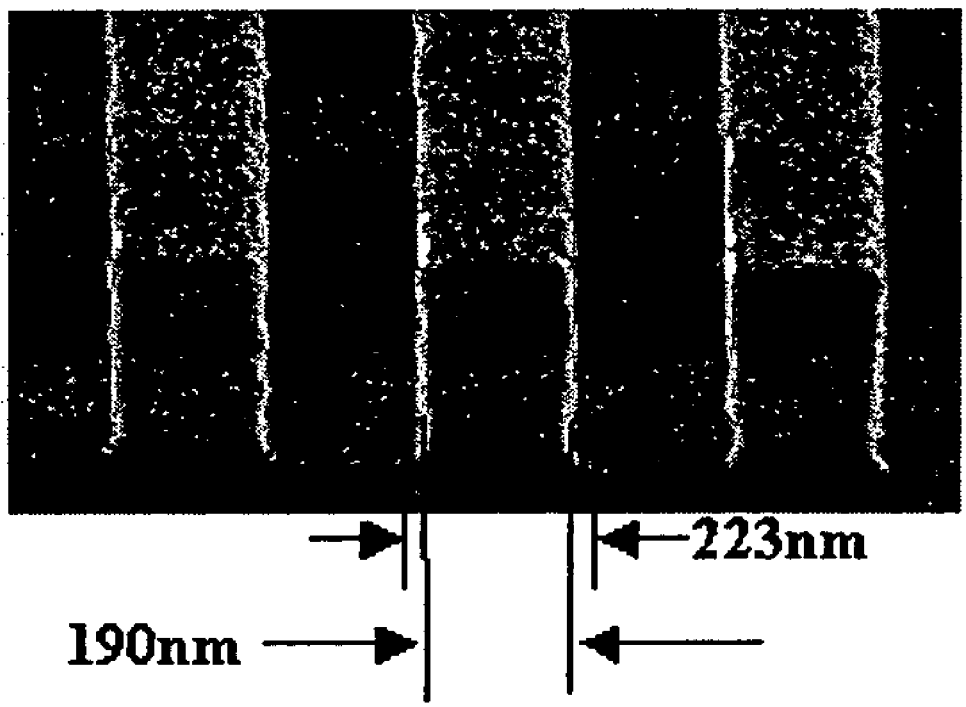
FIG. 1 shows photoresist relief images produced in Example 73 which follows.
Figure 1:
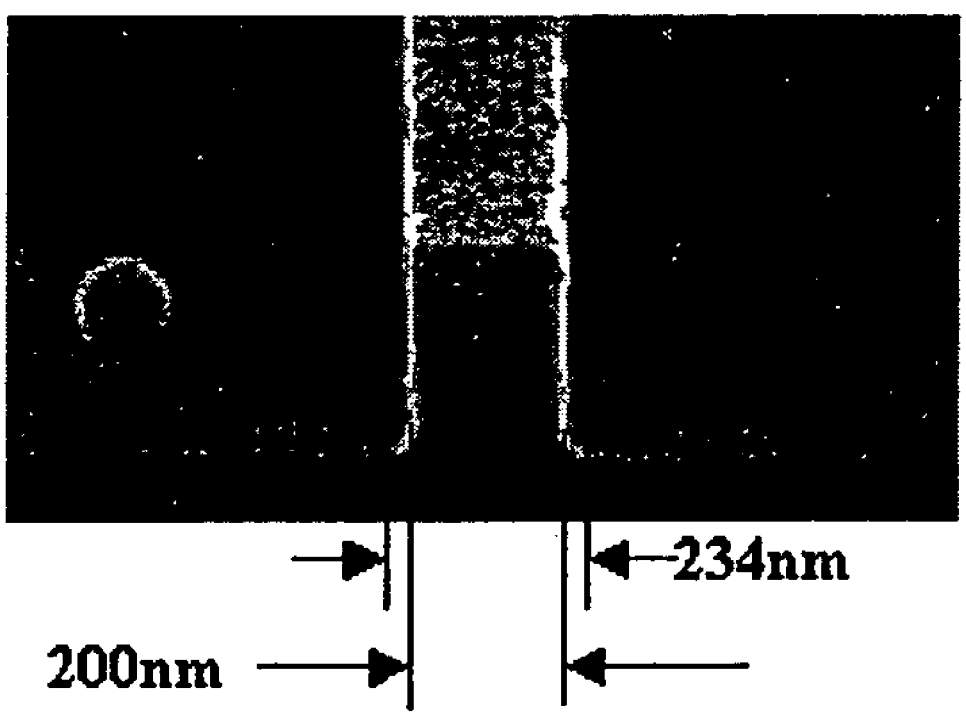

As discussed above, we now provide new organic coating compositions that are particularly useful with an overcoated photoresist layer. Preferred coating compositions of the invention may be applied by spin-coating (spin-on compositions) and formulated as a solvent composition. The coating compositions of the invention are especially useful as antireflective compositions for an overcoated photoresist.

As discussed above, in a first aspect, organic coating compositions are provided that contain a reaction component that can be provided by admixture of materials comprising an amine compound and an anhydride compound or an anhydride derivative compound.

In addition to one or more amine compound and one or more anhydride compounds and/or anhydride derivative compounds, other materials may be admixed together with an amine compound and an anhydride compound or anhydride derivative to provide a reaction component of a coating composition of the invention. For instance, alcohols (including primary and secondary alcohols) and esters including admixture solvents may react with an amine or anhydride compound to provide a material of the reaction component. Suitably, inclusive of a reaction solvent, such as an alcohol solvent, 2, 3, 4, 5 or 6 or more distinct materials are admixed to form material(s) that comprise a reaction component.

Also, by stating that such distinct reagents (e.g., amine, anhydride and/or anhydride derivative, solvent, other reactive material, etc.) provide a reaction component as an admixture product it is meant that the reagents are admixed together and typically react in some respect, whether or not involving covalent bonding-breaking or covalent bond-forming interactions, but that the distinct reagents also may be unreacted and constitute a material of the reaction component. Generally, however, at least some ionic or covalent bond-forming or covalent bond-breaking interactions occur between one or more of distinct reagents in order to form the reaction component, even if some or a significant portion (e.g., at least about 5, 10, 20, 30, 40, 50, 60, 70, 80 or 90 weight percent, not including solvent) of all the distinct reagents in admixture do not react with any of the other reagents in admixture.

Additionally, the mixture of distinct reagents (e.g., amine, anhydride and/or anhydride derivative, solvent, other reactive material, etc.) can be formulated as the reaction component of a coating composition without purification of the admixture (reaction) product of the reagents. Thus, for instance, the admixture of reagents can be directly formulated with one or more coating solvents for the coating composition, and the reaction solvent(s) will be a component of the casting solvent. If desired, however, the reaction component may be isolated or otherwise purified (e.g., via fractionation, chromatography) prior to formulation to produce a coating composition of the invention.

Preferred amine compounds used to form a reaction component include compounds having multiple amine moieties, particularly multiple primary or secondary amine groups. Generally preferred amine compounds have at least 2, 3, 4 or 5 primary or secondary amine groups, more preferably at least 2, 3, 4 or 5 primary amine groups. The amine compounds may be aromatic or non-aromatic. Preferred amine compounds include those that comprise one or more aromatic moieties, such as one or more optionally substituted carbocyclic aryl groups, e.g. one or more optionally substituted phenyl, optionally substituted naphthyl and/or optionally substituted anthracenyl.

Additional preferred amine compounds to form reaction compounds of coating compositions of the invention are heterocyclic amines that have one or more nitrogen ring members, preferably with one or more primary or secondary amino groups (e.g. amino (i.e. —NH$_2$ or C$_{1-12}$aminoalkyl) as ring substituents. More particularly, preferred nitrogen heterocycles include reagents that comprise one more moieties of pyrazine, pyridazine, pyrimidine, pyridine, benzothiaozole (including 2,1,3-benzothiazole), and the like, preferably with one or more ring substituents that are primary or secondary amine groups such as C$_{1-12}$aminoalkyl.

Specifically preferred amine compounds useful to form reaction compounds of coating compositions of the invention include the following, where in some cases the compound name is set forth directly below the compound structure. Preferred amine compound also are disclosed in the examples which follow.

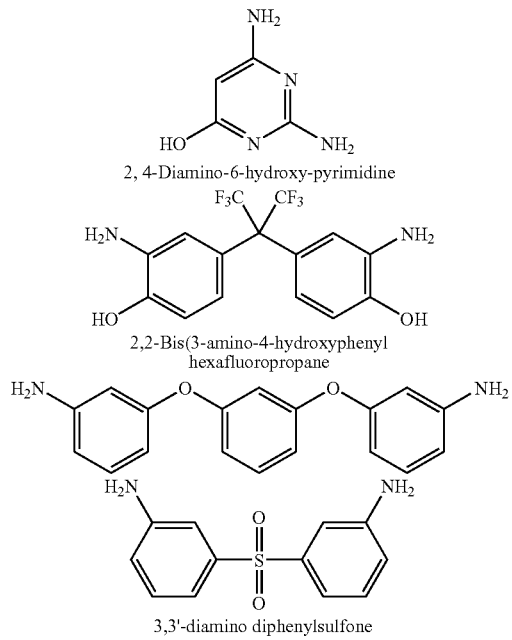

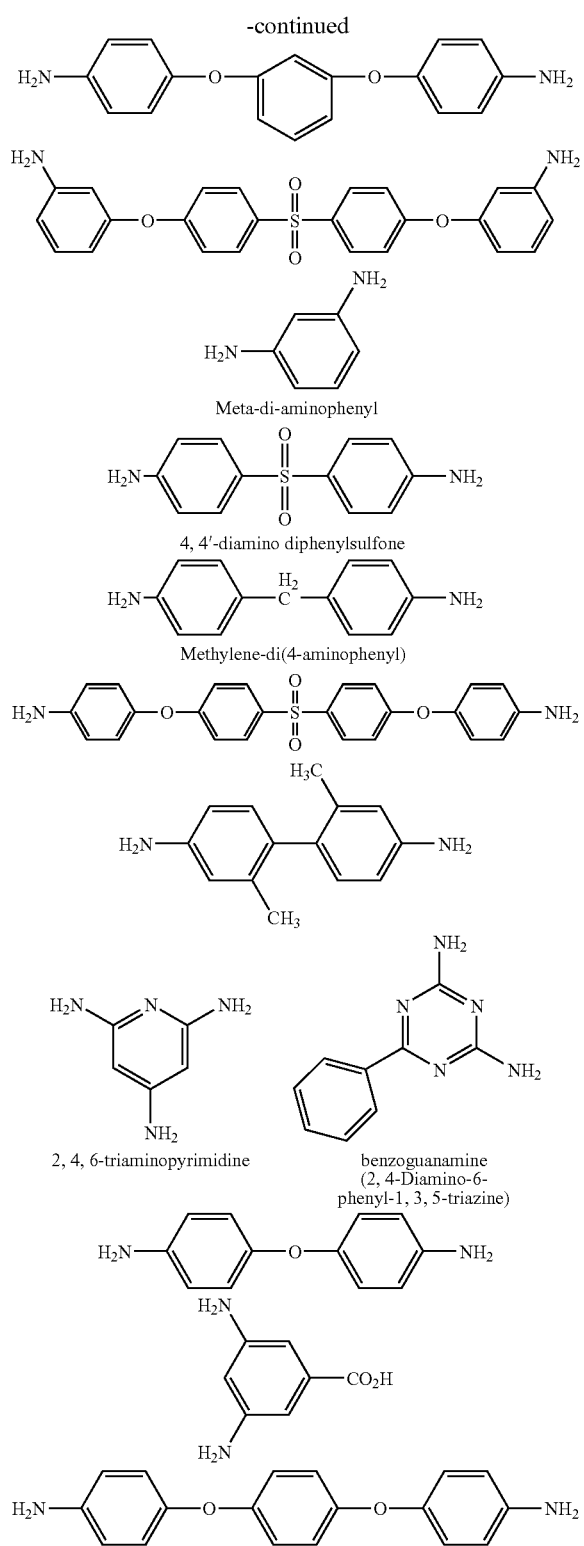

Preferred anhydride and anhydride derivative compounds used to form a reaction component include compounds having multiple anhydride moieties, particularly 2 or 3 anhydride moieties. The anhydride and anhydride derivative compounds may be aromatic or non-aromatic. Preferred anhydride and anhydride derivative compounds include those that comprise one or more aromatic moieties, such as one or more optionally substituted carbocyclic aryl groups, e.g. one or more optionally substituted phenyl, optionally substituted naphthyl and/or optionally substituted anthracenyl.

As discussed above, an anhydride derivative is inclusive of those groups or compounds that contains moieties that can be functionalized to an anhydride Specifically preferred anhydride compounds useful to form reaction compounds of coating compositions of the invention include the following, where in some cases the compound name is set forth directly below the compound structure. Preferred anhydride compound also are disclosed in the examples which follow.

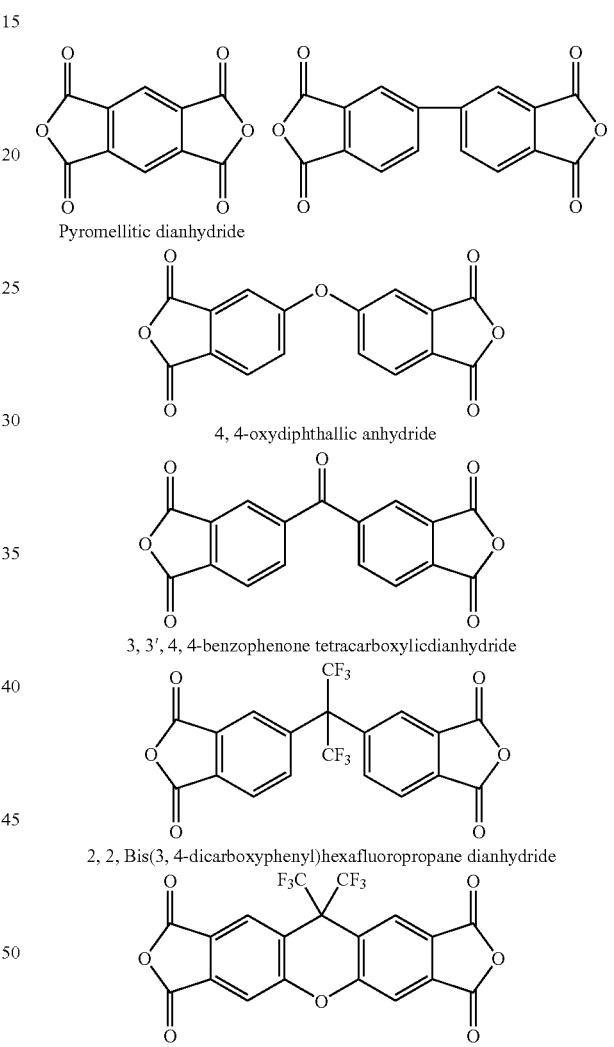

As discussed above, to enhance antireflective properties of a composition of the invention, it is generally preferred that at least one of an amine compound and an anhydride or an anhydride derivative compound that are reacted to form a reaction compound comprise one or more aromatic groups. Such aromatic groups can serve as effective chromophores and absorb and prevent undesired reflection of exposure radiation back into an overcoated photoresist layer.

Particularly preferred materials to form a reaction component include benzophenone-3,3',4,4'-tetracarboxylic dianhydride. Additional preferred anhydrides to use to form a reaction component include 4,4'-oxydiphthallic anhydride, phthallic anhydride and trimellitic anhydride. Particularly preferred multifunctional amines to use to form a reaction component include 3,3'-diamino diphenylsulfone, 4,4'-diamino diphenylsulfone, and 2,4,6-triaminopyrimidine. It is also preferred to utilize an admixture solvent to form the reaction component that comprises or consists of one or more primary or secondary alcohols, still more preferably one or more secondary alcohols such as glycols including propylene glycol methyl ether acetate (1-methoxy-2-propanol acetate), propylene glycol methyl ether (1-methoxy-2-propanol), and the like.

Preferred reaction components also include those that are the admixture product of 1) a multi-functional anhydride compound (i.e. ≧2 anhydride groups on a single compound), 2) a mono-functional anhydride compound (i.e. the compound has a total of one anhydride groups), and 3) an amine, particularly a multifunctional amine (i.e. having ≧2 amine compounds on a single compound). Preferred multifunctional anhydride compounds include benzophenone-3,3',4,4'-tetracarboxylic dianhydride, and 4,4'-oxydiphthallic anhydride. Preferred mono-functional anhydride compounds include compounds having a molecular weight of about 400 daltons or less, more preferably about 250 daltons or less-such as phthallic anhydride and trimetallic anhydride. As discussed, a mono-functional anhydride can cap terminal amine groups, e.g. by forming an imide group. Preferred amine compounds include 3,3'-diamino diphenylsulfone, 4,4'-diamino diphenylsulfone, and 2,4,6-triaminopyrimidine.

Reaction compounds of the invention can be prepared by a variety of methods. For instance, as discussed above, an amine compound and anhydride compound or anhydride derivative compound can be admixed in one or more organic solvents and stirred with heating to promote reaction. Suitable reaction temperatures can be from 40° C. or higher e.g. up to reflux and for times sufficient to promote reaction of the amine and anhydride reagents e.g. 1, 2, 10, 24 or 48 hours. A variety of organic reaction solvents can be employed, with alcohols being generally preferred. Suitable alcohol solvents e.g. glycols such as propylene glycol methyl ether and the like. Primary and secondary alcohol solvent can be more reactive with amine/anhydride/anhydride derivative compounds, relative to tertiary alcohol solvents.

Additionally, rather than admnixing the amine and anhydride reagents in whole at the start of a reaction, one reagent may be added to the other over the course of the reaction. For instance, a reaction vessel can be charged with an amine reagent in an organic solvent and the anhydride reagent added in portions over the course of the reaction.

It also has been found that reaction of one or more compounds having multiple amine groups and one or more compounds having multiple anhydride groups can provide a reaction product that has terminal amine moiety. Such amine groups can potentially comprise lithographic performance, e.g. by complexing with photogenerated acid in an overcoated resist layer.

It thus has been found that reaction of such terminal amine groups may be desired to form a less reactive functionality that will not react with resist photoacid, or otherwise adversely affect lithographic performance. For instance, such "capping" of terminal amine groups can be accomplished by use of a mono-anhydride compound to form a terminal imide group. The mono-anhydride compound suitably may be present in the reaction mixture at the start of the reaction with the amine compound(s) and compounds having at multiple anhydride groups or derivatized anhydride groups, or the mono-anhydride may be added to the reaction mixture during the course of the reaction.

Particularly preferred syntheses are set forth in the examples which follow.

It also has found that use of an alcohol solvent to prepare a reaction compound can result in the alcohol being incorporated into the reaction compound. This has been indicated by various analyses, including proton-NMR.

As indicated above, it also has been found that under the reaction conditions discussed above a reaction composition may be readily produced that comprises a mixture of distinct materials, including esterified groups (e.g., anhydrides esterified by alcohol solvent) and various intermediate reaction products. For instance, various analyses include proton-NMR indicate that the material initially produced by Example 33 may include the following distinct compounds, and non-covalently bound polymeric salts of the compounds:

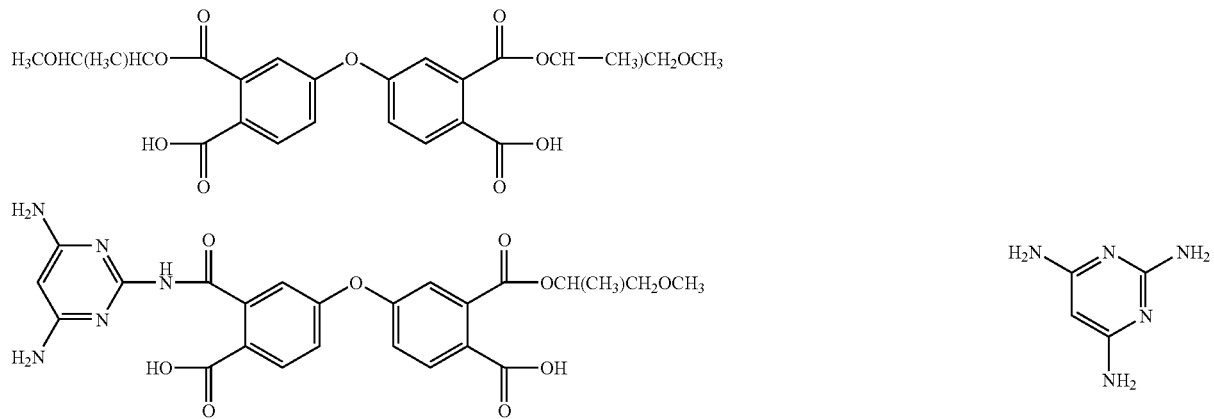

As demonstrated in the examples which follows, it has been found that such a reaction composition that comprises such a mixture of materials can be effectively formulated as a coating composition of the invention and be applied as a quality coating layer on a microelectronic wafer or other substrate.

Additionally, while not being bound by any theory, it is believed that as such a composition coating layer is baked during processing (i.e. thermal cure prior to applying an overcoating resist layer) de-esterification reaction(s) occurs between these various molecular species, and polyamic acid(s) forms resulting in an increase in the molecular weight. As the thermal cure progresses, it is believed that at least some of the polyamic acid can imidize to produce a polyimide. In any event, thermal treatment of a coating layer of such reaction component can induce a molecular weight increase of one or more materials of the reaction component.

As discussed above, coating compositions that are used for antireflective applications also suitably may contain a material that contains chromophore units that is separate from the reaction component. For instance, the coating composition may comprise a polymeric or non-polymeric compound that contain aromatic groups e.g. carbocyclic aryl or heteroaromatic groups such as phenyl, anthracene, naphthyl, etc. units. It is often preferred, however, that the reaction component provide the chromophore units of the coating composition.

As also discussed above, preferred antireflective coating compositions of the invention can be cured (molecular weight increase), e.g. by thermal and/or radiation treatment. For example, as discussed above, coating compositions of the invention may contain a separate crosslinker component that can crosslink with one or more other components of the composition. Thus, such coating compositions would contains as separate components: a reaction component, a crosslinker, and an optional component of an acid or a thermal acid generator compound.

A variety of thermal acid generator compounds may be employed in a coating composition of the invention, including both ionic as well as substantially neutral thermal acid generators, e.g. an ammonium arenesulfonate salt, for catalyzing or promoting crosslinking during curing of an composition coating layer. If used, one or more thermal acid generators may be suitably present in a coating composition in a concentration from about 0.1 to 10 percent by weight of the total of the dry components of the composition (all components except solvent carrier), more preferably about 2 percent by weight of the total dry components.

As discussed above, a coating composition of the invention is suitably formulated as a liquid spin-on composition and contain one or more blended solvents. Suitable solvents include e.g. a lactate such as ethyl lactate or methyl acetate, an acetate such as amyl acetate, anisole, one or more of the glycol ethers such as 2-methoxyethyl ether (diglyme), ethylene glycol monomethyl ether, and propylene glycol monomethyl ether; solvents that have both ether and hydroxy moieties such as methyl-2-hydroxyisobutyrate, methoxy butanol, ethoxy butanol, methoxy propanol, and ethoxy propanol; esters such as methyl cellosolve acetate, ethyl cellosolve acetate, propylene glycol monomethyl ether acetate, dipropylene glycol monomethyl ether acetate and other solvents such as dibasic esters, propylene carbonate and gamma-butyro lactone, ketones such as heptanone (particularly 2-heptanone) and cyclohexanone, and the like.

To make a liquid coating composition of the invention, the component(s) of the coating composition are dissolved in a suitable solvent such as, for example, one or more of ethyl lactate, propylene glycol methyl ester acetate, and/or methyl-2-hydroxyisobutyrate. The preferred concentration of the dry component(s) in the solvent will depend on several factors such as the method of application. In general, the solids content of a coating composition varies from about 0.5 to 20 weight percent of the total weight of the coating composition, preferably the solids content varies from about 2 to 10 weight of the coating composition.

A variety of photoresist compositions can be employed with coating compositions of the invention, including positive-acting and negative-acting photoacid-generating compositions, as discussed above. Photoresists used with coating compositions of the invention typically comprise a resin and a photoactive component, typically a photoacid generator compound. Preferably the photoresist resin binder has functional groups that impart alkaline aqueous developability to the imaged resist composition.

As discussed above, particularly preferred photoresists for use with coating compositions of the invention include chemically-amplified resists, including positive-acting chemically-amplified resist compositions, where the photoactivated acid in the resist layer induces a deprotection-type reaction of one or more composition components to thereby provide solubility differentials between exposed and unexposed regions of the resist coating layer. A number of chemically-amplified resist compositions have been described, e.g., in U.S. Pat. Nos. 4,968,581; 4,883,740; 4,810,613; 4,491,628 and 5,492,793, al of which are incorporated herein by reference for their teaching of making and using chemically amplified positive-acting resists.

Coating compositions of the invention also may be used with other positive resists, including those that contain resin binders that comprise polar functional groups such as hydroxyl or carboxylate and the resin is used in a resist composition in an amount sufficient to render the resist developable with an aqueous alkaline solution. Generally preferred resist resins are phenolic resins including phenol aldehyde condensates known in the art as novolak resins, homo and copolymers or alkenyl phenols and homo and copolymers of N-hydroxyphenyl-maleimides.

Preferred positive-acting photoresists for use with an underlying coating composition of the invention contains an imaging-effective amount of photoacid generator compounds and one or more resins that are selected from the group of:

1) a phenolic resin that contains acid-labile groups that can provide a chemically amplified positive resist particularly suitable for imaging at 248 nm. Particularly preferred resins of this class include: i) polymers that contain polymerized units of a vinyl phenol and an alkyl acrylate, where the polymerized alkyl acrylate units can undergo a deblocking reaction in the presence of photoacid. Exemplary alkyl acrylates that can undergo a photoacid-induced deblocking reaction include e.g. t-butyl acrylate, t-butyl methacrylate, methyladamantyl acrylate, methyl adamantyl methacrylate, and other noncyclic alkyl and alicyclic acrylates that can undergo a photoacid-induced reaction, such as polymers in U.S. Pat. Nos. 6,042,997 and 5,492,793, incorporated herein by reference; ii) polymers that contain polymerized units of a vinyl phenol, an optionally substituted vinyl phenyl (e.g. styrene) that does not contain a hydroxy or carboxy ring substituent, and an alkyl acrylate such as those deblocking groups described with polymers i) above, such as polymers described in U.S. Pat. No. 6,042,997, incorporated herein by reference; and iii) polymers that contain repeat units that comprise an acetal or ketal moiety that will react with photoacid, and optionally aromatic repeat units such as phenyl or phenolic groups; such polymers have been described in U.S. Pat. Nos. 5,929,176 and 6,090,526, incorporated herein by reference.

2) a resin that is substantially or completely free of phenyl or other aromatic groups that can provide a chemically amplified positive resist particularly suitable for imaging at sub-200 nm wavelengths such as 193 nm. Particularly preferred resins of this class include: i) polymers that contain polymerized units of a non-aromatic cyclic olefin (endocyclic double bond) such as an optionally substituted norbornene, such as polymers described in U.S. Pat. Nos. 5,843,624, and 6,048,664, incorporated herein by reference; ii) polymers that contain alkyl acrylate units such as e.g. t-butyl acrylate, t-butyl methacrylate, methyladamantyl acrylate, methyl adamantyl methacrylate, and other non-cyclic alkyl and alicyclic acrylates; such polymers have been described in U.S. Pat. No. 6,057,083; European Published Applications EP01008913A1 and EP00930542A1; and U.S. pending patent application Ser. No. 09/143,462, all incorporated herein by reference, and iii) polymers that contain polymerized anhydride units, particularly polymerized maleic anhydride and/or itaconic anhydride units, such as disclosed in European Published Application EP01008913A1 and U.S. Pat. No. 6,048,662, both incorporated herein by reference.

3) a resin that contains repeat units that contain a hetero atom, particularly oxygen and/or sulfur (but other than an anhydride, i.e. the unit does not contain a keto ring atom), and preferable are substantially or completely free of any aromatic units. Preferably, the heteroalicyclic unit is fused to the resin backbone, and further preferred is where the resin comprises a fused carbon alicyclic unit such as provided by polymerization of a norborene group and/or an anhydride unit such as provided by polymerization of a maleic anhydride or itaconic anhydride. Such resins are disclosed in PCT/US01/14914 and U.S. Pat. No. 6,306,554.

4) a resin that contains fluorine substitution (fluoropolymer), e.g. as may be provided by polymerization of tetrafluoroethylene, a fluorinated aromatic group such as fluoro-styrene compound, and the like. Examples of such resins are disclosed e.g. in PCT/US99/21912.

Coating compositions of the invention also are preferably used with negative-acting photoresist compositions.

Preferred negative-acting resist compositions for use with a coating composition of the invention comprise a mixture of materials that will upon exposure to photoacid cure, crosslink, harden or otherwise be rendered comparatively less soluble with respect to aqueous alkaline developer relative to photoresist layer regions that are not exposed to photoacid.

Particularly preferred negative-acting resist compositions comprise a resin including a phenolic resin for 248 nm imaging or a substantially non-aromatic resin for sub-200 nm imaging, a crosslinker component and a photoactive component such as one or more photoacid generator compounds. Such preferred negative-acting compositions and the use thereof have been disclosed in European Patent Applications 0164248 and 0232972 and in U.S. Pat. No. 5,128,232 to Thackeray et al. Preferred phenolic resins for use as the resin binder component include novolaks and poly(vinylphenol)s as disclosed in those cited published patent documents. Preferred crosslinkers for a negative-acting resist include amine-based materials, including melamine, glycourils, benzoguanamine-based materials and urea-based materials. Melamine-formaldehyde resins are generally most preferred. Such crosslinkers are commercially available, e.g. the melamine resins sold by American Cyanamid under the trade names Cymel 300, 301 and 303. Glycouril resins are sold by American Cyanamid under trade names Cymel 1170, 1171, 1172 and Powderlink 1174, urea-based resins are sold under the trade names of Beetle 60, 65 and 80, and benzoguanamine resins are sold under the trade names Cymel 1123 and 1125.

Suitable photoacid generators to employ in a positive or negative acting photoresist coated over or above a coating composition of the invention include imidosulfonates such as compounds of the following formula:

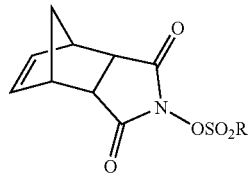

wherein R is camphor, adamantane, alkyl (e.g. $C_{1-12}$ alkyl) and perfluoroalkyl such as perfluoro($C_{1-12}$alkyl), particularly perfluorooctanesulfonate, perfluorononanesulfonate and the like. A specifically preferred PAG is N-[(perfluorooctanesulfonyl)oxy]-5-norbornene-2,3-dicarboximide.

Sulfonate compounds are also suitable PAGs for resists overcoated a coating composition of the invention, particularly sulfonate salts. Two suitable agents for 193 nm and 248 nm imaging are the following PAGS 1 and 2:

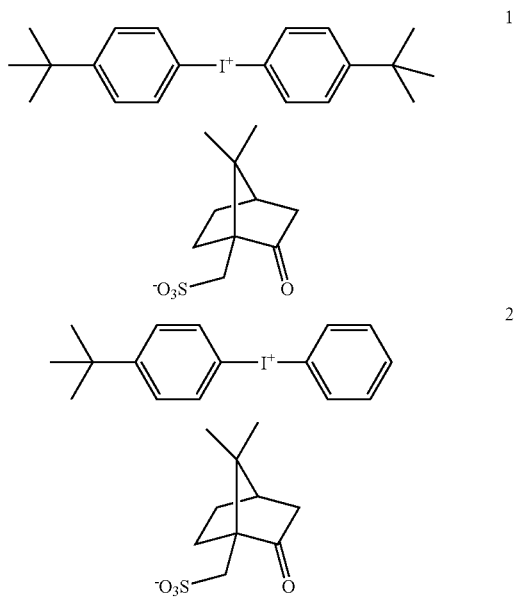

Such sulfonate compounds can be prepared as disclosed in European Patent Application 96118111.2 (publication number 0783136), which details the synthesis of above PAG 1.

Also suitable are the above two iodonium compounds complexed with anions other than the above-depicted camphorsulfonate groups. In particular, preferred anions include those of the formula $RSO_3$— where R is adamantane, alkyl (e.g. $C_{1-12}$ alkyl) and perfluoroalkyl such as perfluoro ($C_{1-12}$alkyl), particularly perfluorooctanesulfonate, perfluorobutanesulfonate and the like.

Other known photoacid generator compounds also may be employed in the resists of the invention, such as other onium salts including those disclosed in U.S. Pat. Nos. 4,442,197, 4,603,101, and 4,624,912, as well as non-ionic organic photoactive compounds such as the halogenated photoactive compounds as in U.S. Pat. No. 5,128,232 to Thackeray et al. Additional suitable photoacid generators for use in photoresists employed with coating compositions of the invention include sulfonate photoacid generators including sulfonated esters and sulfonyloxy ketones. See J. of Photopolymer Science and Technology, 4(3):337-340 (1991), for disclosure of suitable sulfonate PAGS, including benzoin tosylate, t-butylphenyl alpha-(p-toluenesulfonyloxy)-acetate and t-butyl alpha(p-toluenesulfonyloxy)-acetate. Preferred sulfonate PAGs are also disclosed in U.S. Pat. No. 5,344,742 to Sinta et al.

Photoresists for used with an underlying coating composition of the invention also may contain other materials.

A preferred optional additive of photoresists overcoated a coating composition of the invention is an added base, particularly tetrabutylammonium hydroxide (TBAH), or tetrabutylammonium lactate, which can enhance resolution of a developed resist relief image. For resists imaged at 193 nm, a preferred added base is a hindered amine such as diazabicyclo undecene or diazabicyclononene. The added base is suitably used in relatively small amounts, e.g. about 0.03 to 5 percent by weight relative to the total solids.

Other optional photoresist additives include actinic and contrast dyes, anti-striation agents, plasticizers, speed enhancers, etc. Such optional additives typically will be present in minor concentration in a photoresist composition except for fillers and dyes which may be present in relatively large concentrations such as, e.g., in amounts of from about 5 to 50 percent by weight of the total weight of a resist's dry components.

Various substituents and materials (including reaction components and reagents to form same, resins, small molecule compounds, acid generators, etc.) as being "optionally substituted" may be suitably substituted at one or more available positions by e.g. halogen (F, Cl, Br, I); nitro; hydroxy; amino; alkyl such as $C_{1-8}$ alkyl; alkenyl such as $C_{2-8}$ alkenyl; alkylamino such as $C_{1-8}$ alkylamino; carbocyclic aryl such as phenyl, naphthyl, anthracenyl, etc; and the like.

As discussed above, in use, a coating composition of the invention is applied as a coating layer to a substrate by any of a variety of methods such as spin coating. The coating composition in general is applied on a substrate with a dried layer thickness of between about 0.02 and 0.5 µm, preferably a dried layer thickness of between about 0.04 and 0.20 µm. The substrate is suitably any substrate used in processes involving photoresists. For example, the substrate can be silicon, silicon dioxide or aluminum-aluminum oxide microelectronic wafers. Gallium arsenide, silicon carbide, ceramic, quartz or copper substrates may also be employed. Substrates for liquid crystal display or other flat panel display applications are also suitably employed, for example glass substrates, indium tin oxide coated substrates and the like. Substrates for optical and optical-electronic devices (e.g. waveguides) also can be employed.

As discussed preferably the applied coating layer is treated (e.g. thermal treatment) to induce molecular weight increases of composition components before a photoresist composition is applied over the composition layer. Thermal treatment conditions can vary with the components of the coating composition, particularly if the coating composition contains an acid or acid source such as a thermal acid generator. Suitable thermal treatment cure conditions may range from about 140° C. to 250° C. for about 0.5 to 30 minutes. Thermal cure conditions preferably render the coating composition coating layer substantially insoluble to solvent carrier of the overcoated photoresist composition to avoid any significant intermixing of the coating layer (i.e. the underlayer composition of the invention and overcoated resist layer), but where the underlying composition coating layer is not rendered insoluble (or at least ineffective or too slow dissolution rates) with respect to an alkaline aqueous photoresist developer solution.

After treatment of the coating composition layer, a photoresist is applied over the surface of the coating composition. As with application of the bottom coating composition, the overcoated photoresist can be applied by any standard means such as by spinning, dipping, meniscus or roller coating. Following application, the photoresist coating layer is typically dried by heating to remove solvent preferably until the resist layer is tack free.

The resist layer is then imaged with activating radiation through a mask in a conventional manner. The exposure energy is sufficient to effectively activate the photoactive component of the resist system to produce a patterned image in the resist coating layer. Typically, the exposure energy ranges from about 3 to 300 mJ/cm$^2$ and depending in part upon the exposure tool and the particular resist and resist processing that is employed. The exposed resist layer may be subjected to a post-exposure bake if desired to create or enhance solubility differences between exposed and unexposed regions of a coating layer. For example, negative acid-hardening photoresists typically require post-exposure heating to induce the acid-promoted crosslinking reaction, and many chemically amplified positive-acting resists require post-exposure heating to induce an acid-promoted deprotection reaction. Typically post-exposure bake conditions include temperatures of about 50° C. or greater, more specifically a temperature in the range of from about 50° C. to about 160° C.

The exposed resist coating layer is then developed, preferably with an aqueous based developer such as an alkali exemplified by tetra butyl ammonium hydroxide, sodium hydroxide, potassium hydroxide, sodium carbonate, sodium bicarbonate, sodium silicate, sodium metasilicate, aqueous ammonia or the like. In general, development is in accordance with art recognized procedures, except that development will also result in removal of the underlying coating composition layer in those areas underlying resist layer regions removed by the developer. Preferably, development will be terminated (e.g. by spin-drying and/or water rinse) once development of the image transferred from the resist layer is complete in the underlying coating layer to avoid excessive and undesired removal of the underlying, e.g. removal of the composition coating layer is areas where the resist layer is retained after difficult. Optimal development times to avoid either under-development or over-development of the underlying coating composition layer can be readily determined empirically with any particular system of resist, underlying composition, developer composition and development conditions, e.g. the development can be conducted for varying times prior to termination as discussed above, and the developed images evaluated such as by scanning electron micrographs (SEMS) to determine development times or time ranges where over-development or under-development does not occur.

Following development, a final bake of an acid-hardening photoresist is often employed at temperatures of from about 100° C. to about 150° C. for several minutes to further cure the developed exposed coating layer areas.

The developed substrate may then be selectively processed on those substrate areas bared of photoresist and the underlying coating composition layer, for example, chemically etching or plating substrate areas bared of photoresist in accordance with procedures well known in the art. Suitable etchants include a hydrofluoric acid etching solution and a plasma gas etch such as an oxygen plasma etch. Notably, an additional step of plasma removal of the underlying composition layer is not required where removal is accomplished in the same step as photoresist layer development, as discussed above.

All documents mentioned herein are incorporated herein by reference in their entirety.

The following non-limiting examples are illustrative of the invention. In the various Tables set forth in the examples, abbreviations set forth within the Tables are defined at the end of the Tables.

EXAMPLES 1-20

Preparation of Amine/anhydride Reaction Products by Isolation Method

Examples 1-6

General Procedure for Amine/Anhydride Reaction Products (e.g. Polyamic Acids (PAA)) by Isolation Method In a 250 mL round bottom flask equipped with a reflux condenser were added anhydride, amine, and N-methylpyrrolidone (NMP), and the mixture was stirred for 72 hours at room temperature under nitrogen atmosphere. Added to the solution was m-xylene, and the mixture was stirred for 8 hours at a certain temperature. After cooling to room temperature, the solution was precipitated in water and filtered. The polyamic acid was then vacuum dried at 50° C. for 24 hours.

By that general procedure, amines and anhydrides were reacted to provide a reaction product as specified in the following Table 1 for each of Examples 1 through 6:

TABLE 1

| Examples | Amine | Wt. of amine (g) | Anhydride | Wt. of anhydride (g) | Temperature (° C.) | Yield (g) |
|---|---|---|---|---|---|---|
| 1 | 6FDA | 5.00 | TAP | 0.939 | 180 | 4.74 |
| 2 | 6FDA | 4.00 | TAP | 0.751 | 25 | 4.33 |
| 3 | s-BPDA | 5.00 | TAP | 1.42 | 180 | 6.14 |
| 4 | s-BPDA | 4.00 | TAP | 1.13 | 25 | 4.89 |
| 5 | BTDA | 8.00 | TAP | 2.07 | 180 | 5.47 |
| 6 | 6FDA | 10.00 | BG | 4.21 | 180 | 8.70 |

6FDA = 2,2-Bis(3,4-dicarboxyphenyl)hexafluoropropane dianhydride
s-BPDA = 3,3'-4,4'-Biphenylcarboxylic dianhydride
BTDA = Benzophenone-3,3',4,4'-tetracarboxylic dianhydride
TAP = 2,4,6-Triaminopyrimidine
BG = Benzoguanamine: 2,4-Diamino-6-phenyl-1,3,5-triazine Examples 7-20

General Procedure for Thermal Treatment of Amine/Anhydride Reaction Products (e.g. Thermal Imidization of Polyamic Acids (PAA)) that had been Synthesized by Isolation Method Dried PAA sample was cured for 24 hours under vacuum at a certain temperature. After thermal curing, solubility of the resulting polyimide was tested in a vial, and optical characteristics were measured in thin film by ellipsometer.

By that general procedure, amine/anhydride reaction products were reacted to provide a reaction product as specified in the following Table 2 for each of Examples 7 through 20:

TABLE 2

| Examples No. | PAA Examples | Cure temperature (° C.) | Cure time (hours) | Good solvent | Optical density (μm$^{-1}$ at 248 nm) | n | k |
|---|---|---|---|---|---|---|---|
| 7 | 1 | 100 | 24 | 2.38% TMAH, THF, PGME, EL, DMF, DMAc | 5.5 | 1.91 | 0.253 |
| 8 | 1 | 140 | 24 | 2.38% TMAH, THF, PGME, EL, DMF, DMAc | | | |
| 9 | 1 | 170 | 24 | 2.38% TMAH, THF, PGME, EL, DMF, DMAc | | | |
| 10 | 1 | 200 | 24 | 2.38% TMAH (Δ), THF, PGME (Δ), EL (Δ), DMF, DMAc | | | |
| 11 | 1 | 230 | 6 | 2.38% TMAH, THF, PGME (Δ), EL, DMF, DMAc | | | |
| 12 | 1 | 230 | 12 | 2.38% TMAH, THF, | | | |

TABLE 2-continued

| Examples No. | PAA Examples | Cure temperature (° C.) | Cure time (hours) | Good solvent | Optical density (μm$^{-1}$ at 248 nm) | n | k |
|---|---|---|---|---|---|---|---|
| 13 | 1 | 230 | 20 | PGME (Δ), EL, DMF, DMAc 2.38% TMAH (Δ), THF, PGME (Δ), EL, DMF, DMAc | | | |
| 14 | 1 | 230 | 24 | 2.38% TMAH (Δ), THF, PGME (Δ), EL(Δ), DMF, DMAc | | | |
| 15 | 2 | 90 | 24 | 2.38% TMAH, Acetone, THF, PGME, EL | | | |
| 16 | 3 | 90 | 24 | 2.38% TMAH | | | |
| 17 | 4 | 90 | 24 | 2.38% TMAH (swelling) | | | |
| 18 | 5 | 230 | 24 | Insoluble | | | |
| 19 | 6 | 175 (9% weight loss) | 24 | PGME, EL, PGMEA | | | |
| 20 | 6 | 200 (15% weight loss) | 24 | PGME (Δ), EL, PGMEA | | | |

TMAH = tetramethyl ammonium hydroxide
THF: tetrahydrofuran
PGME: propylene glycol methyl ether
DMF = dimethyl formaide
DMAc = dimethyl acetamide Examples 21-46

General Procedure for Amine/anhydride Reaction Products (e.g. Polyamic Acids (PAA)) by One-pot Method In a 250 mL screw cap glass bottle were added amine and solvent, and the mixture was stirred for 1 hour. Added to the solution was dianhydride (50%, 25%, and 25% separately), and the mixture was stirred for 1 hour after each dianhydride addition. The reaction mixture was then stirred for additional 24 hours, and the solution was filtered through 0.2 μm syringe filter.

By that general procedure, amines and anhydrides were reacted to provide a reaction product as specified in the following Table 3 for each of Examples 21 through 46:

TABLE 3

| Examples | Anhydride | Wt. of anhydride (g) | Amine | Wt. of amine (g) | Feed ratio (anhydride/amine) | Solvent | Wt. of solvent (g) | Temper. (° C.) | End-capping |
|---|---|---|---|---|---|---|---|---|---|
| 21 | 6FDA | 2.76 | BG | 1.25 | 0.93/1.00 | PGME | 96 | 25 | |
| 22 | BTDA | 2.45 | BG | 1.53 | 0.93/1.00 | PGME | 96 | 25 | |
| 23 | ODPA | 2.43 | BG | 1.58 | 0.93/1.00 | PGME | 96 | 25 | |
| 24 | BTDA | 2.88 | TAP | 1.12 | 1/1 | PGME | 96 | 25 | |
| 25 | BTDA | 3.18 | TAP | 0.82 | 3/2 | PGME | 96 | 25 | |
| 26 | BTDA | 1.59 | TAP | 0.41 | 3/2 | HBM | 48 | 25 | |
| 27 | BTDA | 1.59 | TAP | 0.41 | 3/2 | 2-Ethoxyethanol | 48 | 25 | |
| 28 | BTDA | 3.18 | TAP | 0.82 | 3/2 | PGME | 96 | 25 | 10% PA |
| 29 | BTDA | 3.18 | TAP | 0.82 | 3/2 | PGME | 96 | 25 | 20% PA |
| 30 | BTDA | 3.18 | TAP | 0.82 | 3/2 | PGME | 96 | 25 | 30% PA |

TABLE 3-continued

| Examples | Anhydride | Wt. of anhydride (g) | Amine | Wt. of amine (g) | Feed ratio (anhydride/amine) | Solvent | Wt. of solvent (g) | Temper. (°C.) | End-capping |
|---|---|---|---|---|---|---|---|---|---|
| 31 | BTDA | 3.18 | TAP | 0.82 | 3/2 | PGME | 96 | 25 | 10% TMA |
| 32 | BTDA | 3.18 | TAP | 0.82 | 3/2 | PGME | 96 | 25 | 20% TMA |
| 33 | ODPA | 3.18 | TAP | 0.86 | 3/2 | PGME | 96 | 25 | |
| 34 | ODPA | 3.18 | TAP | 0.86 | 3/2 | PGME | 96 | 25 | 10% PA |
| 35 | ODPA | 3.18 | TAP | 0.86 | 3/2 | PGME | 96 | 25 | 20% PA |
| 36 | ODPA | 3.18 | TAP | 0.86 | 3/2 | PGME | 96 | 25 | 30% PA |
| 37 | s-BPDA | 3.10 | TAP | 0.88 | 3/2 | PGME | 96 | 25 | |
| 38 | PMDA | 2.88 | TAP | 1.10 | 3/2 | PGME | 96 | 25 | |
| 39 | DPSDA | 3.00 | TAP | 1.05 | 1/1 | PGME | 96 | 25 | |
| 40 | BODA | 2.70 | TAP | 1.36 | 1/1 | PGME | 96 | 25 | |
| 41 | CPDA | 2.50 | TAP | 1.49 | 1/1 | PGME | 96 | 25 | |
| 42 | BTDA | 3.02 | DAP | 1.10 | 0.93/1.00 | PGME | 96 | 25 | |
| 43 | BTDA | 2.99 | DAPM | 1.10 | 0.93/1.00 | PGME | 96 | 25 | |
| 44 | BTDA | 2.85 | DAHP | 1.20 | 0.93/1.00 | PGME | 96 | 60 | |
| 45 | BTDA | 1.55 | BAHF | 1.90 | 0.93/1.00 | PGME | 96 | 25 | |
| 46 | BTDA | 2.87 | DAMT | 1.20 | 0.93/1.00 | PGME | 96 | 25 | |

HBM = Methyl-2-hydroxyisobutyrate
PA = Phthalic anhydride
TMA = 1,2,4-Benzenetricarboxylic anhydride
PMDA = Pyromellitic dianhydride
DPSDA = 3,3',4,4'-Diphenylsulfonetetracarboxylic dianhydride
BODA = Bicyclo[2.2.2]oct-7-ene-2,3,5,6-tetracarboxylic dianhydride
CPDA = 1,2,3,4-Cyclopentanetetracarboxylic dianhydride
DAP = 2,6-Diaminopyridine
DAPM = 2,4-Diaminopyrimidine
DAHP = 2,4-Diamino-6-hydroxy-pyrimidine
BAHF = 2,2-Bis(3-amino-4-hydroxyphenyl)hexafluoropropane
DAMT = 2,4-Diamino-6-methyl-1,3,5-triazine Examples 47-48

Optical Characteristics of Amine/anhydride Reaction Products

Optical characteristics of some polymers were measured in thin film by ellipsometer.

TABLE 4

| Example Nos. | Polymer of example | Optical density ($\mu m^{-1}$ at 248 nm) | n | K |
|---|---|---|---|---|
| 47 | 25 | 14.4 | 1.96 | 0.656 |
| 48 | 33 | 15.1 | 1.97 | 0.686 |

Examples 49-55

Syntheses of Reaction Components Using Methyl-2-hydroxy Isobutyrate (HBM) Solvent General Procedure for TAP-Based Materials Prepared in Methyl-2-Hydroxy Isobutyrate (HBM) Solvent In a 250 mL screw cap glass bottle were added amine and solvent, and the mixture was stirred for 1 hour until it completely dissolved. Added to the solution was dianhydride (50%, 25%, and 25% separately), and the mixture was stirred for 1 hour after each dianhydride addition. The reaction mixture was then stirred for additional 24 hours, and the solution was filtered through 0.2 μm filter.

TABLE 5

| Examples | Anhydride | Wt. of anhydride (g) | Amine | Wt. of amine (g) | Solvent | Solid content (%) | Reaction condition (Temperature/Time) |
|---|---|---|---|---|---|---|---|
| 49 | BTDA | 3.18 | TAP | 0.82 | HBM | 4 | 20° C./24 h |
| 50 | BTDA | 5.50 | TAP | 1.42 | HBM | 7 | 20° C./24 h |
| 51 | BTDA | 7.90 | TAP | 2.05 | HBM | 10 | 20° C./24 h |
| 52 | BTDA | 3.18 | TAP | 0.82 | HBM | 4 | (1)20° C./24 h*, (2)60° C./15 h |
| 53 | BTDA | 3.18 | TAP | 0.82 | HBM | 4 | (1)20° C./24 h**, (2)60° C./15 h |

TABLE 5-continued

| Examples | Anhydride | Wt. of anhydride (g) | Amine | Wt. of amine (g) | Solvent | Solid content (%) | Reaction condition (Temperature/Time) |
|---|---|---|---|---|---|---|---|
| 54 | BTDA | 5.50 | TAP | 1.42 | HBM | 7 | (1)20° C./24 h**, (2)60° C./15 h |
| 55 | BTDA | 7.90 | TAP | 2.05 | HBM | 10 | (1)20° C./24 h**, (2)60° C./15 h |

BTDA = Benzophenone-3,3',4,4'-tetracarboxylic dianhydride
TAP = 2,4,6-Triaminopyrimidine
HBM = Methyl-2-hydroxyisobutyrate
*Dianhydride added stepwise.
**Dianhydride added all at once.

Examples 56-66

Syntheses of Additional Polyamic Acids (One-Pot Method)

In a 250 mL screw cap glass bottle were added amine and solvent, and the mixture was stirred for 1 hour. Added to the solution was dianhydride (50%, 25%, and 25% separately), and the mixture was stirred for 1 hour after each dianhydride addition. The reaction mixture was then stirred for additional 24 hours, and the solution was filtered through 0.2 μm syringe filter.

TABLE 6

| Examples | Anhydride | Amine | Feed ratio (anhydride/amine) | Solvent | Wt. of solvent (g) | Temp. (° C.) | End-capping |
|---|---|---|---|---|---|---|---|
| 56 | ODPA | MPD | 0.93/1.00 | PGME | 96 | 25 | |
| 57 | ODPA | MPD | 0.93/1.00 | PGME | 96 | 25 | 10% PA |
| 58 | ODPA | MPD | 0.93/1.00 | PGME | 96 | 25 | 10% TMA |
| 59 | ODPA | MPD | 0.98/1.00 | PGME | 96 | 25 | |
| 60 | ODPA | MPD | 0.98/1.00 | PGME | 96 | 25 | 10% PA |
| 61 | ODPA | MPD | 0.98/1.00 | PGME | 48 | 25 | 10% TMA |
| 62 | ODPA | 3,3'-DDS | 0.93/1.00 | PGME | 48 | 25 | |
| 63 | ODPA | 3,3'-DDS | 0.98/1.00 | PGME | 96 | 25 | |
| 64 | BTDA | 3,3'-DDS | 0.93/1.00 | PGME | 96 | 25 | |
| 65 | BTDA | 3,3'-DDS | 0.98/1.00 | PGME | 96 | 25 | |
| 66 | BTDA | 3,3'-DDS | 0.67/1.00 | PGME | 96 | 25 | 10% TMA |

ODPA = 4,4'-oxydiphthallic anhydride CAS#1823-59-2
BTDA = 3,3',4,4'-benzophenone tetracarboxylicdianhydride CAS#2421-28-5
3,3'-DDS = 3,3'-diamino diphenylsulfone CAS# 599-69-1
PA = phthallic anhydride
TMA = trimellitic anhydride General procedure for making formulations and casting films on wafers: Solutions of approximately 1.5-1.7% of the materials of examples 1-46 and 56-66 were prepared by dilution with additional solvent. Typically the solvent chosen was PGME (propylene glyco monomethyl ether). In some cases, blends of solvents were used in dilution. Typical solvents used to make blends for the purposes of dilution include ethyl lactate, 2-methyl hydroxyisobutyrate, 2-heptanone and cyclohexanone.

After the material was diluted to become a single phase homogeneous solution, it was filtered through a 0.1 micron pore size Teflon filter. We also found that polypropylene and nylon filter membranes also gave satisfactory results.

The filtered solutions were spun-cast onto 200 mm silicon wafers using industry-conventional wafer coating/baking tracks manufactured by either TEL, SVG, or GCA, using an user-adjustable spin speed ranging from 1000 rpm to 5000 rpm. After coating, the wafer underwent a conventional edge-bead removal process using propylene glycol monomethyl ether acetate solvent. Then the coated wafers were baked on a proximity hotplate at the specified temperature for 60 seconds. Coating quality and thicknesses were measure using conventional interferometric techniques, such as instruments manufactured by Thermawave Corp. Typical coating thicknesses after bake ranged from 35 nm to 100 nm. For the purposes of lithographic testing, a coating thickness of 35 nm was chosen, since this corresponded to the first reflectivity minimum. For the purposes of dissolution rate testing, coating thicknesses of approximately 100 nm was typically used.

Example 67

Dissolution Rate Testing in 0.238% TMAH

The dissolution rate of films of the polymers and materials from Examples 1-46 and 56-66 were measured by two techniques: either a conventional commercial multichannel, multiwavelength diode array dissolution rate monitor device, or by means of measuring the change in film thickness before and after contact with developer divided by the development time. Dissolution rates were measured using 0.238% aqueous tetramethyl ammonium hydroxide at 21° C. In the following tables "DR" is the measured dissolution rate in angstroms/second.

|  | BTDA/TAP | | | ODPA/TAP | | |
|---|---|---|---|---|---|---|
| Bake Condition | Δ FT | Solubility | Total DR | Δ FT | Solubility | Total DR |
| 175° C./60 sec | −1194 | 100% | >19.9 | −1125 | 100% | >18.7 |
| 185° C./60 sec | −1079 | 100% | >18 | −1028 | 100% | >17 |
| 195° C./60 sec | −1005 | 100% | >16.7 | −964 | 100% | >16 |
| 205° C./60 sec | −952 | 100% | >15.8 | −760 | 84% | 13 |
| 215° C./60 sec | −912 | 100% | >15 | −278 | 32% | 5 |
| 225° C./60 sec | −797 | 89% | 13 | −121 | 14% | 2 |

| STRIP TEST FOR MATERIAL OPDA/MPD (0.93/1.00 ratio) MATERIAL OF EXAMPLE 101 | | | | |
|---|---|---|---|---|
| Bake Condition | EL Δ FT | PGME Δ FT | PGMEA Δ FT | GBL/n-BA (70/30) FT |
| 200° C./60 sec | 4 | 7 | −4 | |
| 205° C./60 sec | 37 | −7 | 1 | −195 |
| 215° C./60 sec | −10 | 4 | −22 | −115 |
| 225° C./60 sec | −17 | −18 | 9 | |
| 225° C./60 sec (repeat) | −8 | −9 | 12 | −65 |

| PAA Polymers in PGME | Example from | 175° C./60 sec | | 185° C./60 sec | | 200° C./60 sec | | 215° C./60 sec | |
|---|---|---|---|---|---|---|---|---|---|
| | | Solubility | Total DR | Solubility | Total DR | Solubility | Total DR | Solubility | Total DR |
| ODPA/MPD (0.93) | 56 | 100% | >23 | 100% | >24 | 100% | >20 | 9.80% | 2 |
| PA/ODPA/MPD (0.93) | 57 | 100% | >22 | 100% | >21 | 100% | >20 | 2.10% | 0 |
| TMA/ODPA/MPD (0.93) | 58 | 100% | >22 | 100% | >22 | 100% | >20 | 13.77% | 3 |
| ODPA/MPD (0.98) | 59 | 100% | >25 | 100% | >24 | 100% | >22 | 4.78% | 1 |
| PA/ODPA/MPD (0.98) | 60 | 100% | >24 | 100% | >24 | 100% | >22 | 16.78% | 4 |
| TMA/ODPA/MPD (0.98) | 61 | 100% | >25 | 100% | >23 | 100% | >22 | 7.00% | 1 |
| ODPA/3,3'DDS (0.93) | 62 | 100% | >20 | 100% | >20 | 100% | >19 | −0.32% | 0 |
| ODPA/3,3'DDS (0.98) | 63 | 100% | >21 | 100% | >21 | 100% | >20 | −0.40% | 0 |
| BTDA/3,3'DDS (0.93) | 64 | 100% | >21 | 100% | >21 | 100% | >20 | 100.00% | >20 |
| BTDA/3,3'DDS (0.98) | 65 | 100% | >23 | 100% | >22 | 100% | >22 | 100.00% | >21 |

Example 68

Solvent Resistance of Cast and Baked Films

Solvent resistance of the cast and baked film is required to that subsequent photoresist application will not cause problematic intermixing or solvent stripping issued. Solvent resistance of the cast and baked films on silicon wafers was determined by the following technique: Film thickness was measured, then the film was immersed in solvent for 30 seconds, then the film was air dried, then the film thickness was remeasured. The change in film thickness thus represents the amount of the film that was stripped off via solvent contact. Solvents tested for resistance included PGMEA (propylene glycol monomethyl ether acetate), PGME (propylene glycol monomethyl ether), EL (ethyl lactate) and GBL (gamma-butyro-lactone).

Example 69

Water Contact Angle of Cast and Baked Films

Water contact angle was measured to assure the spun cast and baked films had suitable wettability for photoresist coatings. A water contact angle of more than 40 degrees and less than 85 degrees was considered desirable. AR3 is a reference material plasma-developable organic antireflectant composition sold by Shipley Company of Marlborough, Mass.

| Material of Example | Material | 225° C. | 200° C. | 175° C. |
|---|---|---|---|---|
| 25 | BTDA/TAP(3/2) | 54 | 53 | 51 |
| 33 | ODPA/TAP(3/2) | 55 | 52 | 50 |

| MATERIAL | Material of Example | 180° C./60 s | | | 200° C./60 s | | | 215° C./60 s | | |
|---|---|---|---|---|---|---|---|---|---|---|
| | | EL delta FT | PGME delta FT | PGMEA delta FT | EL delta FT | PGME delta FT | PGMEA delta FT | EL delta FT | PGME delta FT | PGMEA delta FT |
| BTDA/TAP | 25 | −1124 | −902 | −232 | −30 | −27 | −13 | −2 | −1 | 0 |
| ODPA/TAP | 33 | −865 | −810 | −237 | −17 | −37 | −14 | −7 | −11 | 0 |

-continued

| Material of Example | Material | 225° C. | 200° C. | 175° C. |
|---|---|---|---|---|
| 59 | ODPA/MPD/TMA (0.98) | 63 | 56 | 58 |
| 65 | ODPA/3,3'-DDS (0.93) | 60 | 57 | 56 |
| 66 | ODPA/3,3'-DDS (0.98) | 57 | 56 | 54 |
| | AR3(Reference) | 58 | | |

Example 70

Determination of Molecular Weights

Molecular weights were determined by gel permeation chromatography using dimethylacetamide as the mobile phase against polystyrene standards.

| Material of Example | Material Composition | Ratio of anhydride monomer/amine monomer | Molecular Weight |
|---|---|---|---|
| | 3,3'-DDS/ODPA/TMA | 0.58 | 11,500 |
| | 3,3'-DDS/ODPA/TMA | 0.88 | 24,200 |
| 66 | 3,3'-DDS/ODPA/TMA | 0.98 | 52,400 |
| | 3,3'-DDS/ODPA/TMA | 1.00 | 75,400 |
| 25 | BTDA/TAP | 0.67 | <4,000 |
| 33 | ODPA/TAP | 0.67 | <4,000 |
| 38 | PMDA/TAP | 0.67 | <4,000 |
| 37 | s-BPDA/TAP | 0.67 | <4,000 |

It was found that the materials of examples 24-41, made with 2,4,6-triamino pyrimidine (TAP), had a low molecular weight. Subsequent studies showed that materials made from benzoguanimine (BG), 2,4-diamino pyrimidine (DAPM), 2,4-diamino-6-hydroxy-pyrimidine (DAHP), and 2,4-diamino-6-methyl-1,3,5-triazine (DAMT), in alcoholic such as propylene glycol monomethyl ether (PGME) also resulted a low molecular weight. However, it was also found that the same materials spin-coated to give a good film quality despite their low molecular weight. Subsequent light scattering studies of these materials found that the average molecular weight of these materials often ranged from about less than 600 Daltons to about 1200 Daltons.

Example 71

Determination of Reflectivity Properties

Reflectivity was modeled using the measured real and imaginary refractive indices (n=1.96, k=0.656) using commercial PROLITH 2 software (ASML Incorporated). Results are shown below for the material of example 25 (BTDA/TAP). Simulation results showed that for this material is minimized when the film thickness of the coating composition layer is about 35 nm.

EXAMPLES 72-75

Lithographic Processing

Examples 72

Lithographic Processing

The lithographic performance of the reaction component produced in Example 25 was evaluated as follows.

1) A filtered solution of the material of Example 25 at approximately 1.7 weight % solids in propylene glycol methyl ether solvent was spin-coated onto a 200 mm silicon wafer using a spin speed of approximately 2500 rpm.

2) The thus applied coating composition layer was baked at 210° C. for 60 seconds to remove the propylene glycol methyl ether solvent.

3) The dried coating composition layer thickness was measured to be about 35 nm.

4) A commercially available negative-acting 248 nm photoresist (UVN30 available from the Shipley Company) was spin-coated onto the wafer at approximately 3000 rpm over the dried underlying composition having the reaction component of Example 25.

5) The wafer with photoresist layer thereon was baked at 120° C. for 60 seconds to remove the photoresist casting solvent.

6) The dried photoresist layer thickness was determined to be about 265 nm.

7) The photoresist coating layer was then step-wise exposed to 248 nm light from a KrF laser using a ASML/800 phototool.

8) The pattern-wise exposed photoresist layer was then baked at 120° C. for 90 seconds.

9) After that post-exposure bake, the photoresist film and underlying antireflective composition layer were then developed using a standard 30 second spray-puddle process using 2.38% aqueous tetramethyl ammonium hydroxide.

10) The developed photoresist and underlying antireflective layers were then rinsed for 15 seconds using a water spray, and then spun dry.

Example 73

Further Lithographic Processing

The lithographic performance of the reaction component produced in Example 25 was further evaluated as follows.

1) A filtered solution of the material of Example 25 at approximately 1.7 weight % solids in propylene glycol methyl ether solvent was spin-coated onto a 200 mm silicon wafer using a spin speed of approximately 2500 rpm.

2) The thus applied coating composition layer was baked at 210° C. for 60 seconds 3) The dried composition coating layer thickness was measured to be about 35 nm.

4) A negative-acting 248 nm photoresist was spin-coated over the dried coating composition layer at approximately 3000 rpm 5) The wafer with photoresist layer thereon was baked at 120° C. for 60 seconds.

6) The dried photoresist thickness was determined to be about 265 nm.

7) The photoresist layer was then step-wise exposed to 248 nm light from a KrF laser using a ASML/800 phototool with a setting of 0.70 NA and 0.67 partial coherence and an exposure dose of about 21 mJ/cm$^2$, using a mask reticle capable of printing fine semiconductor test patterns with dimensions ranging from 100 nm to 300 nm.

8) The pattern-wise exposed photoresist layer was then baked at 120° C. for 90 seconds.

9) The post-exposure baked photoresist layer as well as underlying antireflective coating composition was then developed using a standard 30 second spray-puddle process using 2.38% -aqueous tetramethyl ammonium hydroxide.

10) The developed phototest and underlying antireflective layers were then rinsed for 15 seconds using a water spray, and then spun dry.

11) The wafer was then cross-sectioned and examined using high voltage scanning electron microscopy (SEM). The thus obtained SEM images are shown in FIG. 1.

Example 74

Further Lithographic Processing

The lithographic performance of the reaction component produced in Example 25 was further evaluated as follows.

1) A filtered solution of the material of Example 25 diluted to approximately 1.7 weight % solids in propylene glycol methyl ether solvent was spin-coated onto a 200 mm silicon wafer using a spin speed of approximately 2500 rpm.

2) The thus applied antireflective coating composition layer was baked at 210° C. for 60 seconds to remove the propylene glycol methyl ether solvent.

3) The thus dried coating composition layer thickness was measured to be about 35 nm.

4) A negative-acting 248 nm photoresist was spin-coated onto the wafer over the applied composition coating layer at approximately 3000 rpm 5) The wafer was photoresist layer thereon baked at 120° C. for 60 seconds to remove the photoresist casting solvent.

6) The dried photoresist layer thickness was determined to be about 265 nm.

7) The photoresist layer was then step-wise exposed to 248 nm light from a KrF laser using a ASML/800 phototool with a setting of 0.70 NA and 0.67 partial coherence and an exposure dose of about 21 mJ/cm$^2$, using a mask reticle capable of printing fine semiconductor test patterns with dimensions ranging from 100 nm to 300 nm.

8) The imaged photoresist layer was then baked at 120° C. for 90 seconds.

9) The post-exposure baked photoresist layer was then developed using a standard 30 second spray-puddle process using 2.38% aqueous tetramethyl ammonium hydroxide.

10) The photoresist and underlying antireflective layers were then rinsed for 15 seconds using a water spray, and then spun dry.

Figure 2:
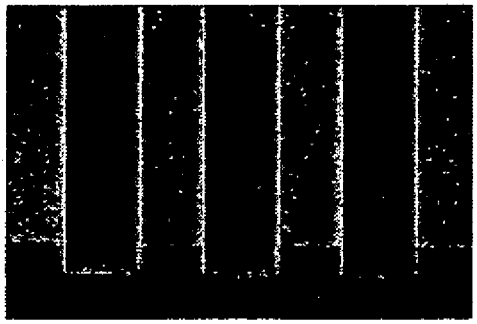
FIG. 2 shows photoresist relief images produced in Example 74 which follows.
Figure 2:
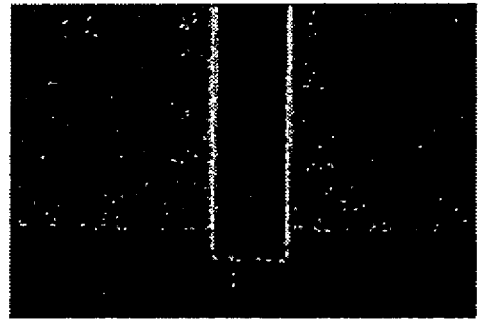
Figure 2:
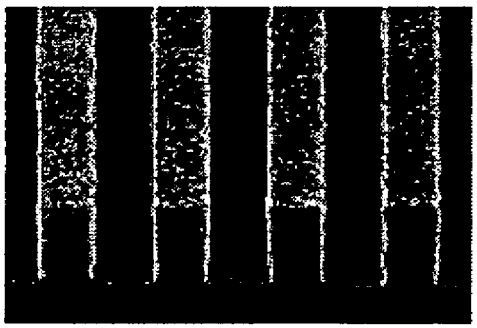
Figure 2:
Figure 2:
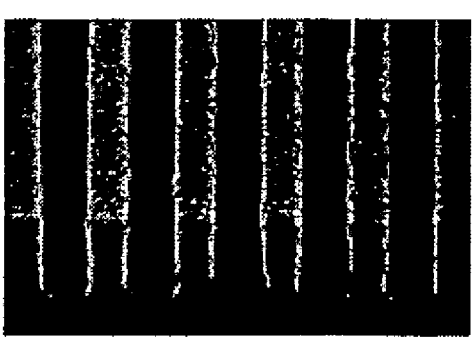
Figure 2:
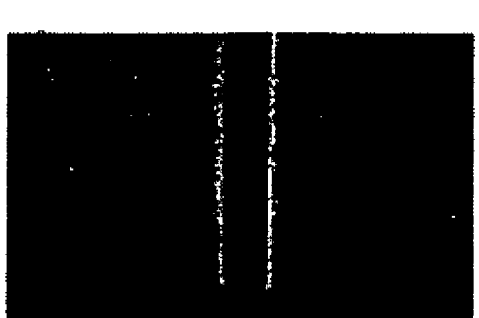

11) The wafer was then cross-sectioned and examined using high voltage scanning electron microscopy (SEM). The thus obtained SEM images are shown in FIG. 2.

Example 75

Further Lithographic Processing

The lithographic performance of the reaction component produced in Example 66 was further evaluated as follows.

1) A filtered solution of the material of Example 66 diluted to approximately 1.7 weight % solids in methyl-2-hydroxyisobutyrate solvent was spin-coated onto a 200 mm silicon wafer using a spin speed of approximately 2500 rpm.

2) The thus applied coating composition layer was baked at, 210° C. for 60 seconds to remove the methyl-2-hydroxyisobutyrate solvent 3) The thus dried coating composition layer thickness was measured to be about 35 nm.

4) A negative-acting 248 nm photoresist was spin-coated onto the wafer over the dried coating composition layer at approximately 3000 rpm.

5) The wafer with photoresist thereon was baked at 120° C. for 60 seconds to remove solvent.

6) The thus dried photoresist layer thickness was determined to be about 265 nm.

7) The dried photoresist layer was then step-wise exposed to 248 nm light from a KrF laser using a ASML/800 phototool with a setting of 0.70 NA and 0.67 partial coherence and an exposure dose of about 21 mJ/cm$^2$, using a mask reticle capable of printing fine semiconductor test patterns with dimensions ranging from 100 nm to 300 nm.

8) The pattern-wise exposed photoresist layer was then baked at 120° C. for 90 seconds.

9) The post-exposure baked photoresist layer and underlying antireflective composition layer were then developed using a standard 30 second spray-puddle process using 2.38% aqueous tetramethyl ammonium hydroxide.

10) The developed photoresist and underlying antireflective layers were then rinsed for 15 seconds using a water spray, and then spun dry.

Figure 3:
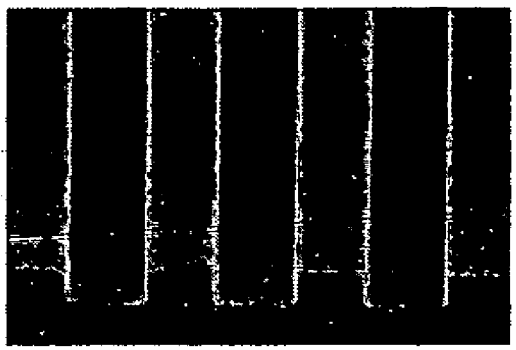
FIG. 3 shows photoresist relief images produced in Example 75 which follows.
Figure 3:
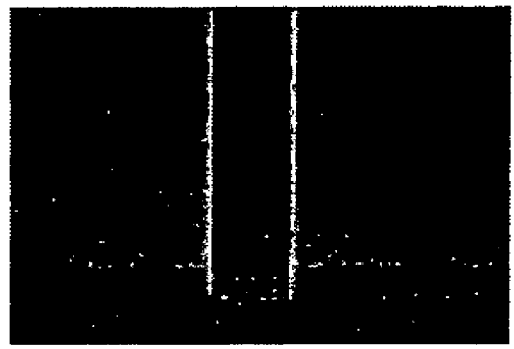
Figure 3:
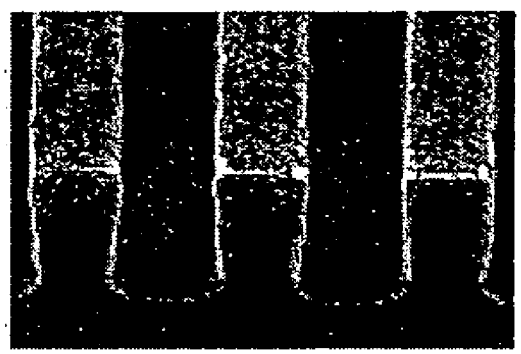
Figure 3:
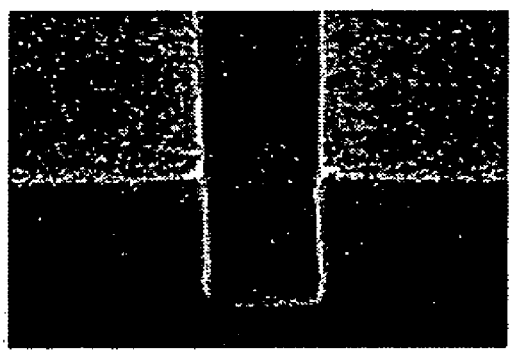
Figure 3:
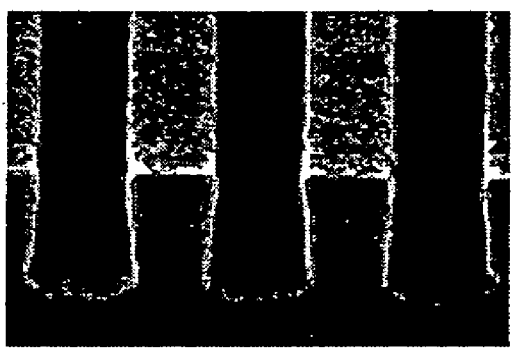
Figure 3:
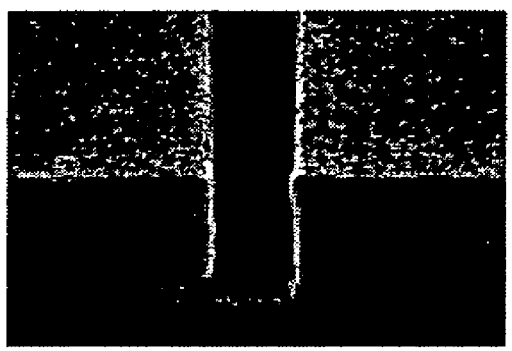

11) The wafer was then cross-sectioned and examined using high voltage scanning electron microscopy (SEM). The thus obtained SEM images are shown in FIG. 3.

The foregoing description of this invention is merely illustrative thereof, and it is understood that variations and modifications can be made without departing from the spirit or scope of the invention as set forth in the following claims.

What is claimed is:

1. A coated substrate comprising:
   an antiretlective composition layer comprising a reaction component,
   the reaction component comprising a product of materials that comprise:
   i) one or more of an anhydride or an anhydride derivative; and
   ii) one or more compounds that comprise 1) three or more amine groups or 2) one or more heterocyclic moieties; and
   a photoresist layer over the antireflective composition layer.

2. The substrate of claim 1 wherein the reaction component comprises a reaction product of materials that comprise a compound having three or more amine groups.

3. The substrate of claim 1 wherein the reaction component comprises a reaction product of materials that comprise a compound having one or more heterocyclic moieties.

4. The substrate of claim 1 wherein the reaction component comprises one or more materials that have a molecular weight of less than about 1,500.

5. The substrate of claim 1 wherein the reaction component comprises one or more chromophore groups.

6. The substrate of claim 1 wherein the anhydride is chosen from among benzophenone-3,3',4,4'-tetracarboxylic dianhydride, 4,4'-oxydiphthallic anhydride, phthallic anhydride and trimellitic anhydride.

7. The substrate of claim 1 wherein the amine is 2,4,6-triaminopyrimidine.

8. A coated substrate comprising:
an antireflective composition layer comprising a reaction component that comprises a polymeric salt reaction product of an amine; and
a photoresist layer over the antireflective composition layer.

9. The substrate of claim 8 wherein the antireflective composition layer comprises a substantially non-polymeric product of materials comprising an amine and an anhydride or an anhydride derivative.

10. The substrate of claim 8 wherein the reaction product is a product of a triamine and a dianhydride.

11. The substrate of claim 8 wherein the reaction product comprises one or more chromophore groups.

12. An antireflective composition layer for use with an overcoated photoresist layer, comprising:
a reaction component that comprises a reaction product of materials comprising:
i) one or more of an anhydride or an anhydride derivative; and
ii) one or more reagent compounds that comprise 1) three or more amine groups or 2) one or more heterocyclic moieties.

13. An antireflective composition layer for use with an overcoated photoresist layer, comprising:
a reaction component that comprises a polymeric salt reaction product of an amine.

14. An antireflective composition comprising a reaction component,
the reaction component comprising a product of materials that comprise:
i) one or more of a compound chosen from among benzophenone-3,3',4,4'-tetracarboxylic dianhydride, and 4,4'-oxydiphthallic anhydride;
ii) one or more mono-anhydride compounds having a molecular weight of about 250 daltons or less; and
iii) one or more compounds chosen from among 3,3'-diamino diphenylsulfone, 4,4'-diamino diphenylsulfone, and 2,4,6-triaminopyrimidine.

15. The antireflective composition of claim 14 wherein the one or more mono-anhydride compounds are chosen from among phthallic anhydride and trimetallic anhydride.

16. The substrate of claim 11 wherein the one or more chromophore groups comprises anthracene groups.

17. The substrate of claim 11 wherein the one or more chromophore groups comprises phenyl groups.

18. The composition of claim 12 where the reaction product comprises one or more chromophore groups.

19. The composition of claim 18 wherein the one or more chromophore groups comprises anthracene groups.

20. The composition of claim 18 wherein the one or more chromophore groups comprises phenyl groups.

21. The composition of claim 13 where the reaction product comprises one or more chromophore groups.

22. The composition of claim 21 wherein the one or more chromophore groups comprises anthracene groups.

23. The composition of claim 21 wherein the one or more chromophore groups comprises phenyl groups.

24. The composition of claim 14 where the reaction product comprises one or more chromophore groups.

25. The composition of claim 24 wherein the one or more chromophore groups comprises anthracene groups.

26. The composition of claim 24 wherein the one or more chromophore groups comprises phenyl groups.

\* \* \* \* \*